United States Patent [19]

Moscony et al.

[11] Patent Number: 4,656,107
[45] Date of Patent: Apr. 7, 1987

[54] PHOTOGRAPHIC PRINTING PLATE FOR USE IN A VACUUM PRINTING FRAME

[75] Inventors: John J. Moscony; Thomas J. Michielutti, both of Lancaster; Charles M. Wetzel, Lititz, all of Pa.

[73] Assignee: RCA Corporation, Princeton, N.J.

[21] Appl. No.: 812,051

[22] Filed: Dec. 23, 1985

Related U.S. Application Data

[62] Division of Ser. No. 507,547, Jun. 24, 1983, Pat. No. 4,588,696.

[51] Int. Cl.⁴ ............................................. G03F 1/00
[52] U.S. Cl. ........................................ 430/5; 430/23; 430/24; 430/950; 430/961
[58] Field of Search ................... 430/5, 23, 24, 950, 430/961

[56] References Cited

U.S. PATENT DOCUMENTS

| | | | |
|---|---|---|---|
| 2,852,379 | 9/1958 | Hepher et al. | 96/91 |
| 3,199,430 | 8/1965 | Brown | 95/73 |
| 3,313,225 | 4/1967 | Mears | 96/75 |
| 3,615,468 | 10/1971 | Tiala | 96/36.3 |
| 3,669,770 | 6/1972 | Feldstein | 156/3 |
| 3,751,250 | 8/1973 | Moscony et al. | 96/36 |
| 3,758,326 | 9/1973 | Hennings et al. | 117/37 R |
| 3,811,893 | 5/1974 | Jannssen et al. | 95/1 R |
| 3,892,571 | 7/1975 | Simeonov et al. | 96/68 |
| 3,897,251 | 7/1975 | Detrick | 96/38.3 |
| 3,906,133 | 9/1975 | Flutie | 428/172 |
| 3,925,677 | 12/1975 | Fraser | 250/505 |
| 3,961,962 | 6/1976 | Sato | 96/87 R |
| 4,061,529 | 12/1977 | Goldman et al. | 156/644 |
| 4,216,289 | 8/1980 | Oda et al. | 430/302 |
| 4,329,410 | 5/1982 | Buckley | 430/5 |
| 4,421,593 | 12/1983 | Curtis et al. | 430/5 |

Primary Examiner—Charles L. Bowers, Jr.
Attorney, Agent, or Firm—Eugene M. Whitacre; Dennis H. Irlbeck; Vincent J. Coughlin, Jr.

[57] ABSTRACT

A method for exposing a layer of photoresist on a sheet includes positioning the sheet in a vacuum printing frame comprising a glass plate carrying an opaque master pattern of metal or metal oxide. With the pattern opposite the coating, the frame is evacuated and the layer is exposed. The pattern has a substantially-uniform thickness in the range of about 0.5±0.2 micrometer. To reduce the times for evacuating and devacuating the frame, the pattern side of the glass plate carries an array of light-transparent islands up to about 3.0-micrometer thick. An overcoating of wax on the islands is a further aid.

7 Claims, 7 Drawing Figures

Fig. 6
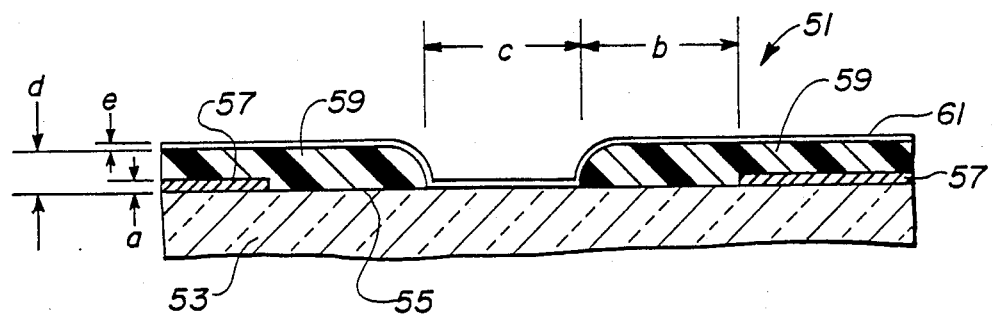
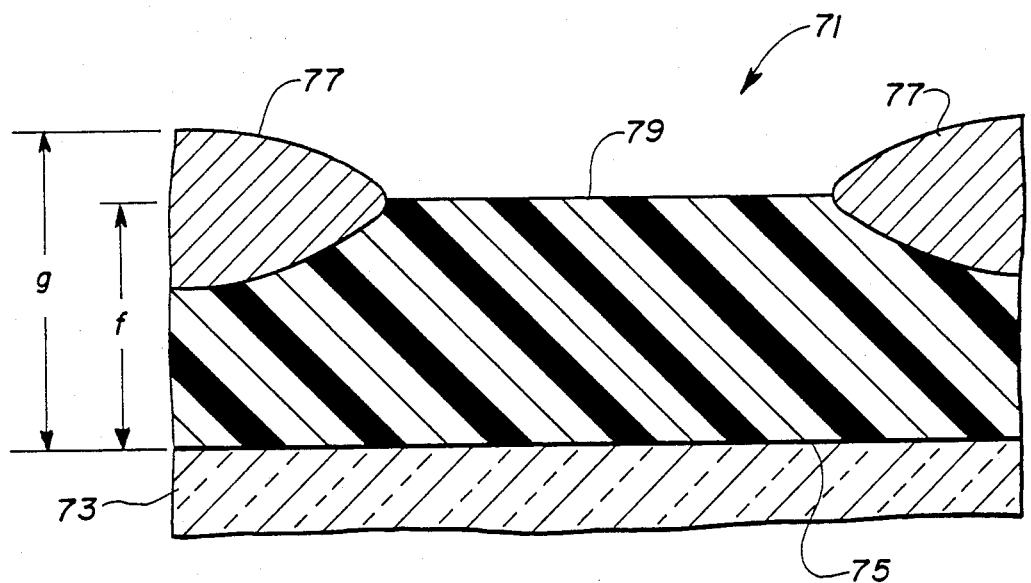
Fig. 7 (Prior Art)

PHOTOGRAPHIC PRINTING PLATE FOR USE IN A VACUUM PRINTING FRAME

This is a division of application Ser. No. 507,547, filed June 24, 1983, Pat. No. 4,588,696.

BACKGROUND OF THE INVENTION

This invention relates to a novel method for photoexposing a coated sheet in a vacuum printing frame prior to etching. The novel method may be used, for example, in preparing apertured masks for use in color television tubes and display picture tubes. The invention includes a novel printing plate which is especially useful in the novel method.

The preparation of apertured masks by photoexposure and etching has been described previously; for example, in U.S. Pat. Nos. 3,199,430 to S. A. Brown, 3,313,225 to N. B. Mears, 3,757,250 to J. J. Moscony et al. and 4,061,529 to A. Goldman et al. In a typical process, a thin sheet of metal, such as cold-rolled steel or a copper-nickel alloy, is coated on both major surfaces with a light-sensitive acid-resist or enamel. Then, the coated sheet is positioned between two photomasks or printing plates, each plate carrying an opaque photographic master pattern on its inward-facing surface, each master pattern being accurately positioned with respect to the other. Each plate is usually comprised of a central area bearing the photographic master pattern and a peripheral area which is clear. The glass plates are mounted in spaced relation from one another in an equipment referred to as a vacuum printing frame. When the coated sheet is in the desired position, the printing frame is evacuated whereby the glass plates are pressed together so that the master patterns are held firmly against the coatings on the sheet. Then, the coatings are exposed to actinic radiation which passes through the glass plates for a time interval until the coatings are suitably exposed. The frame is then devacuated; that is, brought back to atmospheric pressure. The glass plates are separated and the metal sheet with the exposed coatings thereon is removed from the frame. The exposed coatings may now be developed by removing the more-soluble portions thereof. Then, the sheet may be selectively etched, and finally the less-soluble portions of the coatings are removed from the sheet.

One of the problems encountered previously is the relatively poor resolution of the optical image produced during the exposure through the master pattern. Each master pattern is comprised of opaque particles in a binder, such as silver particles in gelatin. The poor resolution is attributed to the relatively large thickness of the pattern which produces a penumbra at the edges thereof, and to variations in thickness of the opaque areas, particularly the tapered thicknesses at the edges thereof, which exhibit partial transmission of the exposing radiation.

Because of poor resolution, and for additional reasons, it is desirable to employ a master pattern of a metal or a metal oxide which is thinner, is substantially uniformly thick and is substantially uniformly opaque to the exposing radiation. Masters of this type which are used to make semiconductor devices have opaque areas that are too thin, and therefore are too transmitting for the longer, more intense exposures used to make apertured masks for cathode-ray tubes. It has also been found that masters of this type can have opaque areas that are too thick, resulting in substantial losses due to cracking and peeling of the opaque areas of the pattern.

Another of the problems encountered previously in making apertured masks for cathode-ray tubes is the relatively long time period required for evacuating and devacuating the printing frame during production operations. Where the photographic master comprises a raised pattern of light-absorbing particles in a binder, such as silver-metal particles or carbon particles in gelatin, part or all of the coating on the peripheral areas of the plate may be cut, etched or sandblasted away to speed the evacuation and devacuation processes. With these different expedients, evacuation times of 45 to 150 seconds are required for each exposure. Where the master pattern is an array of metal or metal oxide areas, the master pattern is substantially flush with the surface of the glass plate, and the time periods required for evacuating and devacuating the frame are substantially longer. When shorter time periods for evacuation and devacuation can be realized, the output from the frame can be increased.

It is desirable, for making apertured masks, to realize the potentially-better image resolution possible with a metal or metal-oxide photographic master pattern. It is economically necessary, when using a metal or metal-oxide master pattern in a vacuum printing frame, to realize the shorter evacuation and devacuation times possible with a raised pattern.

SUMMARY OF THE INVENTION

The novel method employs at least one printing plate, and preferably two plates, including a central area carrying the photographic master pattern. The opaque areas of the pattern have a substantially uniform thickness in the range of 0.5±0.2 micrometer, which thickness range has been found to be critical for using the plates in a vacuum printing frame. Thinner opaque areas exhibit undesirable partial transmission of the exposing radiation. Thicker opaque areas tend to crack and/or peel resulting in excessive losses in manufacture or relatively short working life. The novel method includes the steps employed in prior methods of providing a sheet with a light-sensitive resist, positioning the printing plate and the coated sheet in a vacuum printing frame, evacuating the frame, exposing the coating or coatings to actinic radiation through the master pattern, and then devacuating the frame.

The times required for evacuating and devacuating the vacuum frame can be substantially reduced at a small cost in resolution by another feature of the novel method. The master pattern is coated with islands of a rubbery material that are transmitting to the exposing radiation. The islands preferably have a substantially uniform thickness up to about 3.0 micrometers. In a preferred form of this feature, the islands are of photohardened polymeric material, which islands cover each of the opaque areas of the pattern and extend a distance of up to about 21 micrometers into the transmitting areas adjacent to the pattern. These islands can also be present in the peripheral area of the plate around the central area.

Where a rubbery coating is used over the master pattern, it has been found desirable in some cases to provide a very thin (less than 0.1 micrometer) overcoating of wax over each of the island coatings. The wax overcoating is a filler for imperfections in the rubbery coating and also acts to protect to some degree the underlying coating from abrasion.

BRIEF DESCRIPTION OF THE DRAWINGS

FIG. 6 is a sectional elevational view of a fragment of a glass printing plate with a master pattern thereon as employed in the novel method.

FIG. 7 is a sectional elevational view of a fragment of a prior glass printing plate with a master pattern of silver-gelatin.

DETAILED DESCRIPTION OF THE PREFERRED EMBODIMENT

The novel method is described below as part of a wet chemical etching process for fabricating apertured masks for use in color television picture tubes. However, the novel step of exposing a layer of photoresist in a vacuum printing frame can be used as part of another process which involves another type of etching, or which does not involve etching of the body at all.

Figure 1:
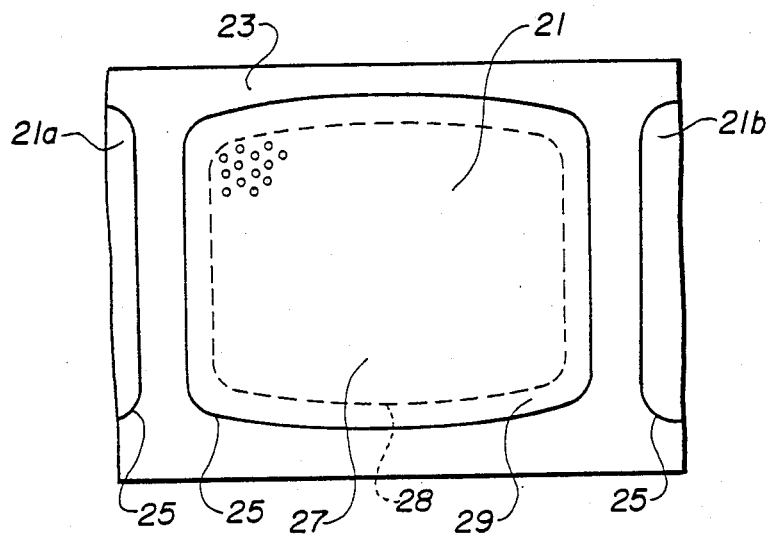
FIG. 1 is a plan view of a metal sheet after etching has been completed and the etch-resistant stencils have been stripped from the sheet according to the novel method.

FIG. 1 shows a plan view of an etched apertured mask blank 21 stripped of its etch-resistant stencils as it emerges from an etching machine. The mask blank 21 (which is to be used in a color-television picture tube) is in a metal sheet 23 comprising a succession of such mask blanks 21a, 21 and 21b which are etched through at the margins 25 thereof except at convenient points (not indicated) sufficient to hold the mask blank in place in the sheet 23. The mask blank 21 is comprised of an apertured central portion 27 defined by the broken line 28, and a skirt or peripheral portion 29 which is not apertured, although in some embodiments it may be etched partly through. The apertures may be round and arranged in a hexagonal, diamond-shaped or other array. Or, the apertures may be rectangular slits arranged in vertical rows; for example, 6-mil by 30-mil slits on 30-mil centers. The apertures may be of other shapes and arrangements. In any of the embodiments, the aperture width may be uniform across the mask or may be graded in spacing, length, width or diameter from the center to the edge of the array as is known in the art.

The mask blank 21 is etched into a regular-carbon or a low-carbon cold-rolled-steel sheet about 4 to 12 mils in thickness. The etching also may be conducted in sheets of other materials, such as low-carbon aluminum-killed steel, invar alloy, or copper-nickel alloy. The sheet 23 is passed through the various operations including cleaning the sheet, producing etch-resistant stencils on the sheet by the novel photoexposure step described herein, etching the sheet to produce the apertures and to define the mask blanks, and then stripping (removing) the stencils from the sheet. Subsequently, the mask blanks 21 are separated from the sheet 23. The mask blanks 21 are then heat treated (annealed), roller leveled, formed on a press, and then blackened as is known in the art, to produce masks suitable for assembly into a color-television picture tube.

Figure 2:
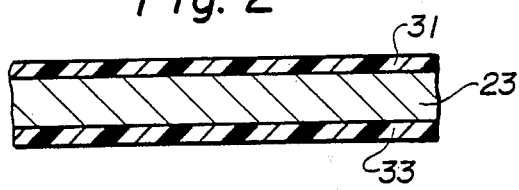
FIGS. 2 through 5 are sectional views through one aperture location of the metal sheet illustrating the steps of one embodiment of the novel method.

FIGS. 2 through 5 illustrate one embodiment of the novel method by a sequence of steps that may be used in making an aperture in the central portion 27 of a hexagonal array of apertures in a 6-mil-thick sheet or strip 23 of low-carbon cold-rolled steel, as shown in FIG. 1. The sheet 23 is coated on both major surfaces with one of the known liquid coating compositions containing acid-precipitated casein and a dichromate sensitizer therefor, and used for this purpose. The coatings are dried in air, producing light-sensitive coatings 31 and 33 of dichromate-sensitized casein, as shown in FIG. 2. Instead of dichromate-sensitized casein, other photosensitized acid resists may be used such as dichromate-sensitized fish glue and dichromate-sensitized polyvinyl alcohol.

Figure 3:
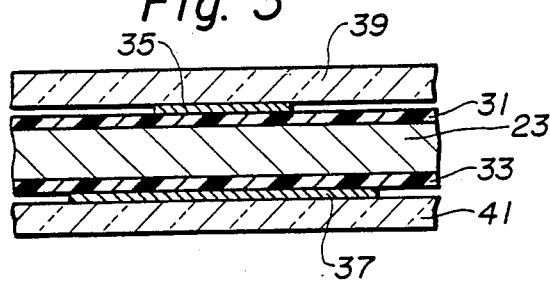

After the light-sensitive coatings 31 and 33 have dried, the coated sheet 23 is positioned in a vacuum printing frame or chase between two light-opaque master patterns 35 and 37, each supported on a separate glass plate 39 and 41; one master pattern 35 for the coating 31 on the one major surface of the sheet 23; and the other master pattern 37 for the other coating 33 on the other major surface of the sheet 23, as shown in FIG. 3. The structure of the master patterns is described in more detail below with respect to FIG. 6. The chamber formed between the glass plates 39 and 41 is exhausted of gases to a low pressure so that the glass plates 39 and 41 are pressed together and the master patterns 35 and 37 are physically close to the coatings 31 and 33. The one master pattern 35 has a circular shape about 1 to 5 mils in outside diameter. The other master pattern 37 has a circular shape about 6 to 16 mils in diameter. Center lines of the one and the other master patterns 35 and 37 are coincident, but may be offset from one another if desired.

With the patterns 35 and 37 positioned as shown in FIG. 3, the coatings 31 and 33 on each of the surfaces of the strip 23 are now exposed to actinic (hardening) radiation, as from a mercury vapor lamp, a carbon-arc source, or a pulsed xenon radiation lamp, which radiation passes through the glass plates 39 and 41 incident on the coatings 31 and 33 except where the one and the other master patterns 35 and 37 shadow the coatings. When the coatings 31 and 33 have been suitably exposed, the exposure is stopped, the printing frame is devacuated and the coated sheet 23 is removed.

Figure 4:
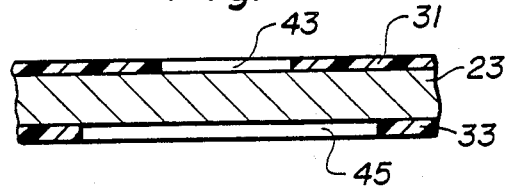

The exposed coatings 31 and 33 are now developed as by flushing with water or other aqueous solvent to remove the unexposed, more-soluble, shadowed portions of the coatings 31 and 33. As shown in FIG. 4, after development, the sheet 23 carries on its one major surface a first stencil comprising a coating 31 having a first circular opening 43 therein and, on its other major surface, a second stencil comprising a coating 33 having a second circular opening 45 therein. The stencil coatings 31 and 33 with the openings 43 and 45 therein are now baked in air, at about 250° C. to 275° C. in this embodiment, to develop better etch-resistance.

Figure 5:
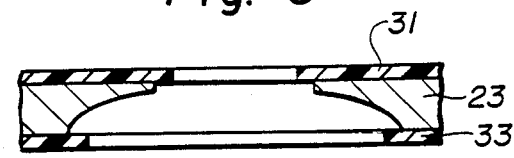

The sheet 23 with the etch-resistant stencils thereon is now selectively etched from both sides thereof in a single step or in successive steps to produce the desired aperture. FIG. 5 shows the stencil-coated sheet 23 at the end of etching. The etching is conducted in the usual manner employing a ferric chloride-hydrochloric acid liquid etchant. Controlled amounts of chlorine gas are fed into the etchant to maintain its etching strength. Most of the etching is done by the ferric chloride and little by the hydrochloric acid. It is only necessary to maintain the pH of the etchant in a desired range with hydrochloric acid concentrations of less than about 0.06 N.

After the etching has been completed, the coated sheet 23 is washed with water to remove any residual etchant. Then, the etch-resistant stencils 31 and 33 are removed from the sheet 23, as by spraying the sheet with an aqueous solution of sodium hydroxide maintained at temperatures in the range of about 50° C. to 80° C. for about 3 to 5 minutes. After removing the stencils, the sheet 23 is washed in water and dried producing the product shown in FIG. 1.

GENERAL CONSIDERATIONS

Except for the photographic printing plate, the various parts of the novel method and the variations thereon can be any of those used previously for making apertured masks. Hence, no further elaboration on these features is necessary.

The photographic printing plate used in the novel method makes possible substantial improvements in the quality of the etched product over similar products made with a previously-used printing plate having a silver-gelatin master pattern. A silver-gelatin pattern is made from a silver halide emulsion, is generally about 2.5±0.5 micrometers thick, and the opaque areas of the pattern are considerably tapered at their edges. By contrast, the opaque areas of the master pattern used in the novel method are thinner, being 0.5±0.2 micrometer thick, and the thickness is substantially uniform with substantially no taper at its edges. Printing plates used in the semiconductor arts have master patterns with opaque areas that are even thinner, being so thin as to be partially transparent to actinic radiation in the wavelengths of interest, and are therefore unsuitable to use in methods for making apertured masks and similar products, which methods contact print the photoresist in a vacuum printing frame.

The printing plate used in the novel method includes a transparent support, preferably a glass plate, having two major surfaces, and an opaque master pattern on one of the surfaces. The opaque master pattern may be constituted of one of a variety of materials such as vapor-deposited chromium, vapor-deposited or chemically-deposited iron oxide or electrolessly-deposited nickel. Uniformly-thick layers of such materials are difficult to provide in the large areas of greater than about 4,000 square centimeters (625 square inches) required for making apertured masks. Furthermore, unlike photomasks used for making semiconductor devices or printed circuit boards, the photomasks used in the novel method must have size tolerances to ±2.5 micrometers with no defects in the entire opaque pattern.

The improvements realized in the etched product are achieved in the exposure process because the relatively thin, opaque master patterns of the printing plates prevent bleed-around and bleed-through of impinging actinic light. The thin master patterns used have sharp edge acuity and are closer spaced to the light-sensitive coatings. The novel process is far superior to the prior practice of using relatively-thick edge-tapered silver-gelatin master patterns, which allow more random bleed-around and bleed-through, which have diffuse edge acuity, and have uneven spacing with the light-sensitive coatings.

In the production of shadow masks, negative resists such as dichromate-sensitized casein, dichromate-sensitized polyvinyl alcohol or dichromate-sensitized fish glue may be used. Thus, positive master-pattern working plates are required to create the stencil. In making the working plates which are used in production, either positive or negative master patterns may be used. When a positive master pattern is used to produce a positive working plate, a positive photoresist is necessary. When a negative master pattern is used to produce a positive working plate, a negative photoresist is necessary. Negative masters are preferred, but either positive or negative resists may be employed in producing working masters and/or working plates.

Because the opaque master pattern is thin and has substantially uniform thickness, the times required for evacuating and devacuating the printing frame are relatively long. These times are tolerable for making working plates. These times are not tolerable when the working plates are being used to make the etched apertured masks.

To shorten the times for evacuating and devacuating the printing frame, it has been found desirable to produce a pattern of transparent islands on the patterned surface of the printing plate. The islands are generally about 1 to 3 micrometers thick, which is much thicker than the opaque master pattern. Hence, the islands can be any size and any arrangement so long as there are continuous paths therebetween. It is preferred that the islands cover the master pattern and, in addition, overlap onto a narrow transparent area immediately adjacent the periphery of the master pattern. Such islands, about 2 micrometers thick, have been effective to reduce the times for evacuation and devacuation from about 300 seconds to 50 seconds. The islands are preferably of a rubbery material rather than a brittle material so as to avoid cracking and chipping. A preferred material is light-hardened (insolubilized) KPR marketed by Eastman Kodak Co., Rochester, N. Y. The rubbery quality provides a cushion and better distributes the pressure between the glass support and the coated metal sheet in the printing frame, thereby reducing breakage of the glass support.

A further improvement can be realized by providing a thin layer, less than 0.1 micrometer thickness, of a soft paste wax comprised of aliphatic hydrocarbons as an overcoating on the tops of the islands. Rain Dance car wax, marketed by Borden, Inc., Columbus, Ohio, has been found to be effective. Such overcoating reduces abrasion of the pattern on the photomask and reduces friction between the photomask and the coated sheet to be etched when the sheet is moved in the printing frame. Also, the overcoating repels particles of dirt so that they do not accumulate on the photomask.

FIG. 6 shows an enlarged idealized view of a fragment of preferred photomask 51 for use in the novel method. The photomask 51 comprises a transparent glass plate 53 about 5 millimeters thick having two major opposed surfaces. One major surface 55 carries an opaque master pattern 57 of iron oxide having a substantially-uniform thickness "a" of about 0.4 micrometer. The iron oxide master pattern 57 is prepared by first providing a uniform adherent layer of iron oxide on the one major surface 55 by vapor deposition or by thermal decomposition of an organo-metallic compound, and then etching the pattern into the layer by methods known in the art. The opaque portions of the pattern 57 are entirely covered by a rubbery coating 59 of light-hardened KPR. The KPR coating 59 also extends a distance "b" about 5 to 20 micrometers beyond the edge of the opaque portions onto the light-transmitting portions of the surface 55 therebetween and leaving a continuous channel between. The islands of KPR may be produced by coating the master pattern and one major surface with KPR, then exposing the KPR to a desired pattern of actinic radiation and then developing the exposed KPR coating. Finally, a wax coating 61 is applied over the entire pattern as described above. In this example, the rubbery coating 59 has a thickness "d" (including the thickness "a" of the master pattern) of about 2.0 micrometers. The wax overcoating 61 has a thickness "e" of about 0.05 micrometer (500 A.).

The preferred photomask 51 is to be compared with a typical prior photomask 71, as shown in FIG. 7. This prior photomask 71 comprises a glass plate 73 about 5 millimeters thick having major opposed surfaces. One major surface 75 carries an opaque pattern 77 of silver-metal particles in a gelatin binder. The pattern 77 is held to the one surface 75 by a clear layer 79 of gelatin. The clear layer 79 has a thickness "f" of about 8.5 micrometers, and the combination of the pattern 77 and the clear layer 79 has a thickness "g" of about 10.5 micrometers. The pattern 77 and clear layer 79 are made in the usual way by photoexposing a silver-halide emulsion to actinic light and then developing the exposed emulsion. This leaves opaque silver-bearing areas (which constitute the pattern 77) that are tapered at their edges. Thus, the pattern 77 is partially transparent around the edges. The areas between the silver-bearing areas 77 are transparent and are not as thick as the silver-bearing areas. Since the silver-bearing areas 77 are thicker, and are tapered and partially transparent at their edges, as compared with the pattern 57 in FIG. 6, the optical image produced by contact printing with the prior photomask in a vacuum frame is more diffuse and less faithful to the original.

The diffuse character of that optical image produces an additional uncertainty factor in the shape of the light-hardened photoresist coating that is contact printed. This uncertainty factor produces general nonuniformity of the shadow masks that are made by the prior method, and also produces similar properties in the luminescent viewing screens made using these shadow masks as photographic negatives. These properties affect directly the ambient appearance and operation of the ultimate products, which are television picture tubes and information display tubes. Products made using the novel method, particularly using the novel printing plates with patterns of iron oxide, exhibit superior uniformity as compared with products made using silver-gelatin patterns for preparing the shadow masks.

What is claimed is:

1. A photographic printing plate for use in a vacuum printing frame comprising an optically-transparent support plate having two opposed major surfaces and an optically-opaque master pattern on one of said major surfaces, said master pattern including an opaque layer of material having a substantially uniform thickness in the range of about 0.5±0.2 micrometers, said plate including a coating of islands of light-transmitting rubbery material over opaque portions of said master pattern on said one major surface, said islands being separated from each other in the non-opaque portions of said master pattern to provide continuous paths therebetween.

2. The plate described in claim 1 wherein said opaque material is selected from the group consisting of iron oxide, chromium metal and nickel metal.

3. The plate described in claim 1 wherein the continuous paths comprise areas that are free from said rubbery material.

4. The plate desribed in claim 1 wherein said islands have substantially uniform thickness up to about 3.0 micrometers and cover all of the opaque portions of said master pattern.

5. The plate described in claim 4 wherein said islands additionally overlap over narrow transparent areas adjacent and peripheral to said master pattern.

6. The plate described in claim 3 wherein the tops of said islands carry a thin overcoating of wax.

7. The plate described in claim 3 including a thin overcoating of wax over said rubbery material.

* * * * *